(12) United States Patent
Aoyama et al.

(10) Patent No.: US 11,646,729 B2
(45) Date of Patent: May 9, 2023

(54) POWER SUPPLY CONTROL DEVICE, OPEN FAILURE DETECTION METHOD AND COMPUTER PROGRAM

(71) Applicants: SUMITOMO WIRING SYSTEMS, LTD., Yokkaichi (JP); TOYOTA JIDOSHA KABUSHIKI KAISHA, Toyota (JP)

(72) Inventors: Shinji Aoyama, Yokkaichi (JP); Hiroshi Kimoto, Yokkaichi (JP); Nobutoshi Hagiwara, Toyota (JP); Takumi Matsumoto, Toyota (JP)

(73) Assignees: Sumitomo Wiring Systems, Ltd., Yokkaichi (JP); TOYOTA JIDOSHA KABUSHIKI KAISHA, Toyota (JP)

( * ) Notice: Subject to any disclaimer, the term of this patent is extended or adjusted under 35 U.S.C. 154(b) by 64 days.

(21) Appl. No.: 17/598,972

(22) PCT Filed: Mar. 25, 2020

(86) PCT No.: PCT/JP2020/013182
§ 371 (c)(1),
(2) Date: Sep. 28, 2021

(87) PCT Pub. No.: WO2020/203511
PCT Pub. Date: Oct. 8, 2020

(65) Prior Publication Data
US 2022/0200591 A1 Jun. 23, 2022

(30) Foreign Application Priority Data
Mar. 29, 2019 (JP) .............................. JP2019-068573

(51) Int. Cl.
*G01R 31/14* (2006.01)
*G01R 31/36* (2020.01)
(Continued)

(52) U.S. Cl.
CPC ... *H03K 17/08122* (2013.01); *G01R 19/0092* (2013.01); *H02H 3/08* (2013.01);
(Continued)

(58) Field of Classification Search
None
See application file for complete search history.

(56) References Cited

U.S. PATENT DOCUMENTS

| 8,699,201 B2 * | 4/2014 | Kohri | H01H 1/0015 |
| | | | 361/187 |
| 9,267,992 B2 * | 2/2016 | Shiraishi | G01R 31/327 |
| (Continued) | | | |

FOREIGN PATENT DOCUMENTS

| JP | H7-281704 A | 10/1995 |
| JP | H11-122805 A | 4/1999 |
| (Continued) | | |

OTHER PUBLICATIONS

International Search Report, Application No. PCT/JP2020/013182, dated Jun. 16, 2020. ISA/Japan Patent Office.

*Primary Examiner* — Kenneth B Wells
(74) *Attorney, Agent, or Firm* — Honigman LLP (57) ABSTRACT

In a first series circuit of a power supply control device, a first switch and a first resistor are connected in series. In a second series circuit, a second switch and a second resistor are connected in series. The second series circuit is connected in parallel to the first series circuit. An electric current detection circuit detects an electric current value of an electric current flowing through the first resistor. In a case where specific data is stored in a storage unit, a control unit (open failure detection unit) detects an open failure of the first switch or the second switch on the basis of the electric current value detected by the electric current detection circuit. In a case where the storage unit does not store the
(Continued)

specific data, the control unit does not detect the open failure.

5 Claims, 6 Drawing Sheets

(51) Int. Cl.
    *H03K 17/0812*     (2006.01)
    *G01R 19/00*     (2006.01)
    *H02H 3/08*     (2006.01)
    *H02H 7/20*     (2006.01)
    *H03K 17/06*     (2006.01)
    *H03K 17/687*     (2006.01)

(52) U.S. Cl.
    CPC ............. *H02H 7/20* (2013.01); *H03K 17/063* (2013.01); *H03K 17/687* (2013.01)

(56) References Cited

U.S. PATENT DOCUMENTS

| | | |
|---|---|---|
| 10,338,126 B2 * | 7/2019 | Kaltenegger ...... G01R 31/2621 |
| 11,362,536 B2 * | 6/2022 | Snyder ................... G01R 31/54 |
| 2012/0161817 A1 | 6/2012 | Kanayama |
| 2018/0131173 A1 | 5/2018 | Iwami et al. |

FOREIGN PATENT DOCUMENTS

| | | |
|---|---|---|
| JP | 2007-285969 A | 11/2007 |
| JP | 2013-205257 A | 10/2013 |
| JP | 2014-239293 A | 12/2014 |
| JP | 2015-095442 A | 5/2015 |

* cited by examiner

POWER SUPPLY CONTROL DEVICE, OPEN FAILURE DETECTION METHOD AND COMPUTER PROGRAM

CROSS-REFERENCE TO RELATED APPLICATIONS

This application is the U.S. national stage of PCT/JP2020/013182 filed on Mar. 25, 2020, which claims priority of Japanese Patent Application No. JP 2019-068573 filed on Mar. 29, 2019, the contents of which are incorporated herein.

TECHNICAL FIELD

The present disclosure relates to a power supply control device, an open failure detection method, and a computer program.

BACKGROUND

Japanese Patent Laid-Open Publication No. 2014-239293 discloses a power supply control device for a vehicle, which controls power supply from a DC power supply to a load. In this power supply control device, one end of each of two semiconductor switches is connected to a positive electrode of the DC power supply. The other end of each of the two semiconductor switches is connected to one end of the load. A control circuit switches the two semiconductor switches ON or OFF. When the two semiconductor switches are ON, power is supplied to the load from the DC power supply via the two semiconductor switches. When the two semiconductor switches are OFF, the power supply to the load is stopped.

It is assumed that an open failure occurs in one of the two semiconductor switches in the power supply control device described in Japanese Patent Laid-Open Publication No. 2014-239293. In this case, when the control circuit attempts to switch ON the two semiconductor switches, one semiconductor switch is not switched to ON so that only the other semiconductor switch is switched to ON. In this case, power is supplied to the load from the DC power supply via one semiconductor switch so that an electric current is concentrated on one semiconductor switch. As a result, the electric current value of the electric current flowing through the semiconductor switch which is switched to ON, is large.

When the electric current flows through the semiconductor switch, the semiconductor switch generates heat so that a temperature of the semiconductor switch rises. The larger the electric current value of the electric current flowing through the semiconductor switch, the larger the amount of heat generated by the semiconductor switch. The temperature of the semiconductor switch rises to be a high temperature. When the temperature of the semiconductor switch is high, it is possible that a failure occurs in the semiconductor switch.

Therefore, in a case where an open failure occurs in one of the two semiconductor switches, when the other semiconductor switch is switched to ON, it is possible that further failure occurs in the semiconductor switch that is switched to ON. In order to prevent the occurrence of this failure, it is necessary to detect the open failure of each of the two semiconductor switches. When the open failure occurs in one semiconductor switch, an occurrence of a further failure is prevented by keeping the other semiconductor switch OFF.

In this regard, it is an object to provide a power supply control device, an open failure detection method, and a computer program capable of detecting an open failure of each of two switches.

SUMMARY

A power supply control device according to an aspect of the present disclosure switches ON or OFF a first switch and a second switch to control power supply via the first switch and the second switch. The power supply control device includes: a first series circuit in which a first resistor and the first switch are connected in series; a second series circuit in which a second resistor and the second switch are connected in series, the second series circuit being connected in parallel to the first series circuit; an electric current detection circuit that detects an electric current value of an electric current flowing through the first resistor; a storage unit in which data is stored; and an open failure detection unit that detects an open failure of the first switch or the second switch based on the electric current value detected by the electric current detection circuit when specific data is stored in the storage unit and that does not detect the open failure when the specific data is not stored in the storage unit.

An open failure detection method according to an aspect of the present disclosure includes: acquiring an electric current value of an electric current flowing through a first resistor of a parallel circuit in which a first series circuit is connected in parallel to a second series circuit, a first switch and the first resistor being connected in series in the first series circuit, a second switch and a second resistor being connected in series in the second series circuit; and detecting an open failure of the first switch or the second switch based on the acquired electric current value when specific data is stored in a storage unit. The open failure is not detected when the specific data is not stored in the storage unit.

A computer program according to an aspect of the present disclosure causing a computer to execute: acquiring an electric current value of an electric current flowing through a first resistor of a parallel circuit in which a first series circuit is connected in parallel to a second series circuit, a first switch and the first resistor being connected in series in the first series circuit, a second switch and a second resistor being connected in series in the second series circuit; and detecting an open failure of the first switch or the second switch based on the acquired electric current value when specific data is stored in a storage unit. The open failure is not detected when the specific data is not stored in the storage unit.

Note that the present disclosure can be implemented not only as a power supply control device including such a characteristic processing unit, but also as a power supply control method having such characteristic processing as a step, or as a computer program for causing a computer to execute such a step. In addition, the present disclosure can be implemented as a semiconductor integrated circuit that implements a part or all of the power supply control device, or can be implemented as a power supply system including the power supply control device.

Effects of Present Disclosure

According to the present disclosure, it is possible to detect an open failure of each of two switches.

DETAILED DESCRIPTION OF PREFERRED EMBODIMENTS

First, embodiments of the present disclosure will be listed and described. At least a part of the embodiments described below may be arbitrarily combined.

A power supply control device according to an aspect of the present disclosure switches ON or OFF a first switch and a second switch to control power supply via the first switch and the second switch. The power supply control device includes: a first series circuit in which a first resistor and the first switch are connected in series; a second series circuit in which a second resistor and the second switch are connected in series, the second series circuit being connected in parallel to the first series circuit; an electric current detection circuit that detects an electric current value of an electric current flowing through the first resistor; a storage unit in which data is stored; and an open failure detection unit that detects an open failure of the first switch or the second switch based on the electric current value detected by the electric current detection circuit when specific data is stored in the storage unit and that does not detect the open failure when the specific data is not stored in the storage unit.

A power supply control device according to an aspect of the present disclosure includes: a writing unit that writes the specific data to the storage unit when an electric device is connected to the parallel circuit of the first series circuit and the second series circuit.

A power supply control device according to an aspect of the present disclosure includes: a switching unit that switches ON the first switch and the second switch when an instruction to write the specific data is given; and a writing unit that writes the specific data to the storage unit when the electric current value detected by the electric current detection circuit exceeds a predetermined electric current value in a state where the switching unit switches ON the first switch and the second switch.

An open failure detection method according to an aspect of the present disclosure includes: acquiring an electric current value of an electric current flowing through a first resistor of a parallel circuit in which a first series circuit is connected in parallel to a second series circuit, a first switch and the first resistor being connected in series in the first series circuit, a second switch and a second resistor being connected in series in the second series circuit; and detecting an open failure of the first switch or the second switch based on the acquired electric current value when specific data is stored in a storage unit. The open failure is not detected when the specific data is not stored in the storage unit.

A computer program according to an aspect of the present disclosure causing a computer to execute: acquiring an electric current value of an electric current flowing through a first resistor of a parallel circuit in which a first series circuit is connected in parallel to a second series circuit, a first switch and the first resistor being connected in series in the first series circuit, a second switch and a second resistor being connected in series in the second series circuit; and detecting an open failure of the first switch or the second switch based on the acquired electric current value when specific data is stored in a storage unit. The open failure is not detected when the specific data is not stored in the storage unit.

In the power supply control device, the open failure detection method, and the computer program according to the aspect described above, in a case where the open failure occurs in the first switch, when the first switch and the second switch are attempted to switch to an ON state, only the second switch is switched to ON. In this instance, since no electric current flows through the first resistor, the electric current value of the electric current flowing through the first resistor is 0 A so as to be small. In a case where the open failure occurs in the second switch, when the first switch and the second switch are attempted to switch to an ON state, only the first switch is switched to ON. In this instance, the electric current value of the electric current flowing through the first resistor is larger than the electric current value of the electric current flowing through the first resistor when the first switch and the second switch are ON. Therefore, when the open failure occurs in the first switch or the second switch, the electric current value of the electric current flowing through the first resistor greatly fluctuates. As a result, it is possible to detect the open failure of the first switch or the second switch based on the electric current value of the electric current flowing through the first resistor.

For example, when power supply via the first switch and the second switch is enabled, specific data is written to the storage unit. In this configuration, while power supply via the first switch and the second switch is not enabled, that is, while an electric current path of an electric current flowing through the first switch and the second switch is not formed, specific data is not stored in the storage unit. Therefore, while power supply via the first switch and the second switch is not enabled, the open failure of the first switch is not erroneously detected.

In the power supply control device according to the aspect described above, when the electric device is connected to the parallel circuit, specific data is written to the storage unit on the assumption that an electric current path of an electric current flowing through the first switch and the second switch is formed.

In the power supply control device according to the aspect described above, when an instruction to write specific data is given, an instruction to switch ON the first switch and the second switch is given. In this state, when the electric current value of the electric current flowing through the first resistor exceeds a predetermined electric current value, specific data is written to the storage unit on the assumption that an electric current path of an electric current flowing through the first switch and the second switch is formed.

Specific examples of a power supply control device according to an embodiment of the present disclosure will be described below with reference to the drawings. It should be noted that the present invention is not limited to these examples, and is indicated by the scope of claims, and is intended to include all modifications within the meaning and scope equivalent to the scope of claims.

In the present embodiment, an electric junction box including the power supply control device will be described as a specific example.

Figure 1:
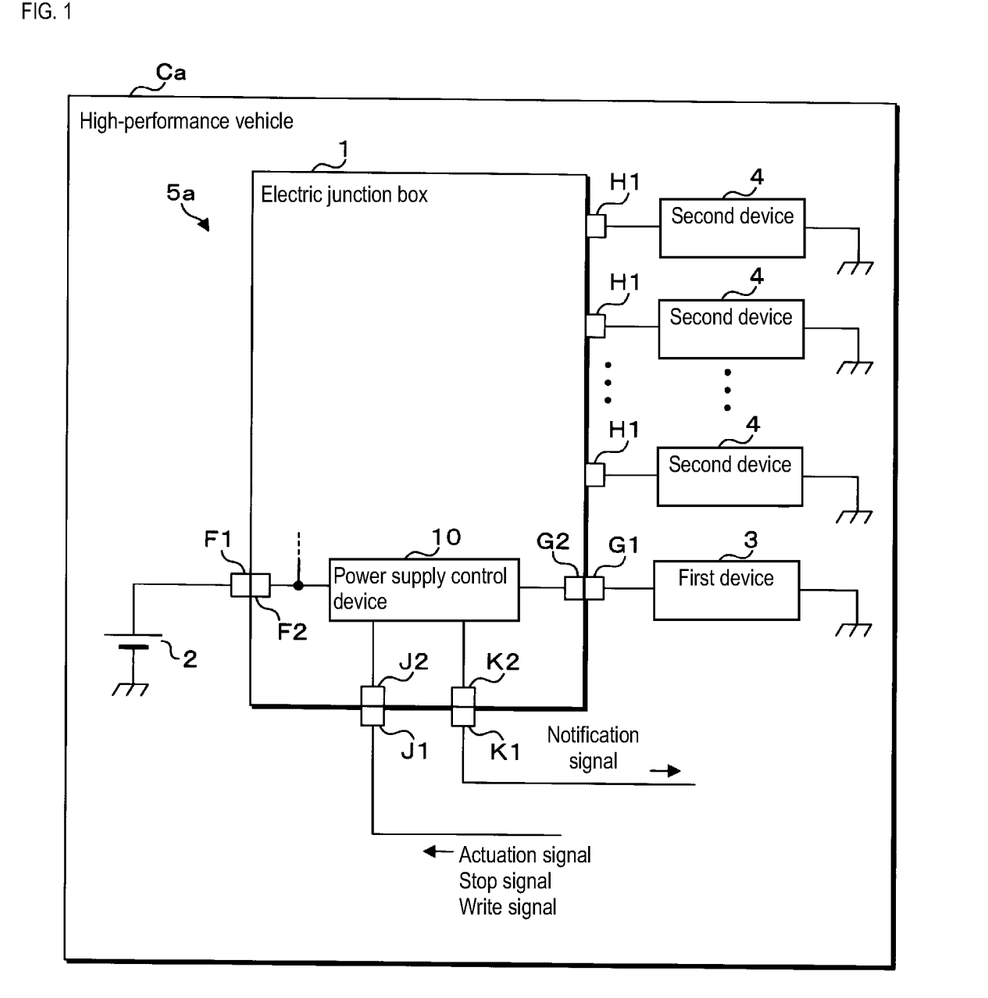
FIG. 1 is an explanatory diagram of an electric junction box in the present embodiment.
Figure 2:
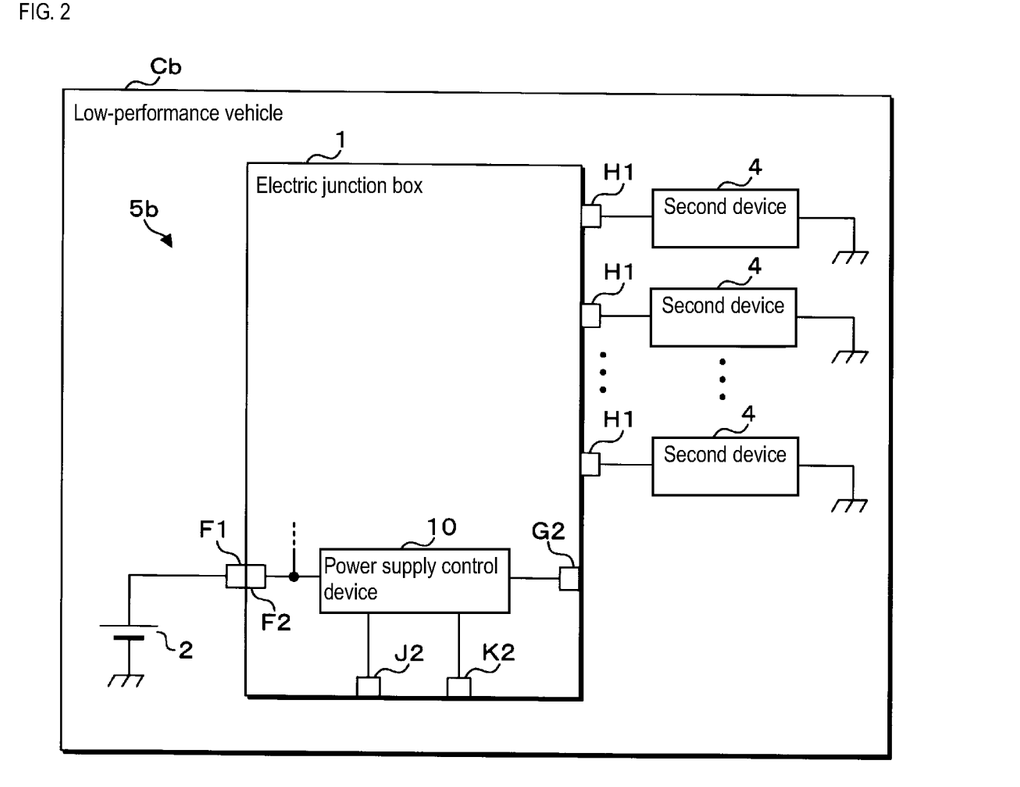
FIG. 2 is an explanatory diagram of the electric junction box in the present embodiment.

FIGS. 1 and 2 are explanatory diagrams of an electric junction box 1 in the present embodiment. As illustrated in FIGS. 1 and 2, the electric junction box 1 is used for general purposes so as to be mounted on a high-performance vehicle Ca and a low-performance vehicle Cb. The high-performance vehicle Ca is equipped with a DC power supply 2, a first device 3, and a plurality of second devices 4 in addition to the electric junction box 1. The DC power supply 2 is, for example, a battery. The low-performance vehicle Cb is equipped with components other than the first device 3 among components mounted on the high-performance vehicle Ca. The first device 3 is not mounted on the low-performance vehicle Cb.

A difference between the high-performance vehicle Ca and the low-performance vehicle Cb is whether or not the first device 3 is mounted. Therefore, when the first device 3 is mounted on the low-performance vehicle Cb, the vehicle on which the electric junction box 1 is mounted is changed from the low-performance vehicle Cb to the high-performance vehicle Ca. Further, the number of the second devices 4 mounted on the high-performance vehicle Ca may be the same as or different from the number of the second devices 4 mounted on the low-performance vehicle Cb.

The first device 3 is an electric device which is not indispensable for driving the high-performance vehicle Ca, power supply of the electric device being controlled. The second device 4 is, for example, an electric device such as a lamp or a wiper motor, power supply of the electric device being controlled. The second device 4 is, for example, an electric device to which power is constantly supplied. The electric device to which power is constantly supplied is, for example, an electronic controller unit (ECU). Note that the second device 4 mounted on the high-performance vehicle Ca may be the same as or different from the second device 4 mounted on the low-performance vehicle Cb in terms of performance, type, etc.

A positive electrode of the DC power supply 2 is connected to a connector F1. A negative electrode of the DC power supply 2 is grounded. The first device 3 is connected to a connector G1. The first device 3 is grounded. Each of the plurality of second devices 4 is connected to a connector H1. Each of the plurality of second devices 4 is grounded. Grounding is performed by connecting to a body of the high-performance vehicle Ca or the low-performance vehicle Cb, for example.

As illustrated in FIG. 1, in the high-performance vehicle Ca, the connectors F1 and G1 and the plurality of connectors H1 are connected to the electric junction box 1. When the connectors F1 and G1 and the plurality of connectors H1 are connected to the electric junction box 1, the DC power supply 2, the first device 3 and the plurality of second devices 4 are connected to the electric junction box 1.

The DC power supply 2 supplies power to the first device 3 and the plurality of second devices 4 via the electric junction box 1. The electric junction box 1 electrically connects the connectors F1 and G1. Furthermore, the electric junction box 1 disconnects this connection. As a result, the electric junction box 1 controls the power supply from the DC power supply 2 to the first device 3.

Further, the electric junction box 1 includes a plurality of connecting devices that connect the DC power supply 2 to the plurality of second devices 4 respectively. The DC power supply 2 supplies power to the plurality of second devices 4 via the plurality of connecting devices. A first example of the connecting device is a fusing element such as a fuse or a fusible link. The fusing element fuses when an electric current value of an electric current flowing through the fusing element becomes equal to or higher than a predetermined electric current value.

A second example of the connecting devices is a transformer circuit such as a step-up circuit or a step-down circuit that transforms an output voltage of the DC power supply 2 to a predetermined voltage. In this case, the transformer circuit transforms the output voltage of the DC power supply 2 and applies the transformed voltage to the second device 4. As a result, power is supplied to the second device 4. A third example of the connecting devices is a switch. When the switch is ON, power is supplied from the DC power supply 2 to the second device 4. When the switch is OFF, the power supply from the DC power supply 2 to the second device 4 is stopped.

Note that a type of each of the plurality of connecting devices may be the same as or different from a type of another connecting device.

The electric junction box 1, the DC power supply 2, the first device 3, and the plurality of second devices 4 are included in a power supply system 5a mounted on the high-performance vehicle Ca.

The electric junction box 1 includes a power supply control device 10 in addition to the connecting devices. The power supply control device 10 is connected to connectors F2, G2, J2, and K2 individually. The connectors F2, G2, J2, and K2 are disposed in the electric junction box 1. The connectors F2, G2, J2 and K2 are connected to the connectors F1, G1, J1 and K1 respectively. The connectors F1, G1, J1, and K1 are disposed outside the electric junction box 1. A signal line for transmitting a signal is connected to each of the connectors J1 and K1.

In the electric junction box 1, the connector F1 is connected not only to the power supply control device 10 but also to a plurality of connecting devices such as the above-mentioned fusing element, transformer circuit, or switch.

By connecting the connector F1 to the connector F2, the DC power supply 2 is connected to the power supply control device 10 and the plurality of connecting devices. By connecting the connector G1 to the connector G2, the first device 3 is connected to the power supply control device 10. By connecting the connectors J1 and K1 to the connectors J2 and K2, respectively, two signal lines are connected to the power supply control device 10.

An actuation signal, a stop signal and a write signal are input to the power supply control device 10 via the connectors J1 and J2. The actuation signal gives an instruction to perform an operation of the first device 3. The stop signal gives an instruction to stop the operation of the first device 3. The write signal gives an instruction to write, to the electric junction box 1, connection data indicating connection of the first device 3.

Figure 4:
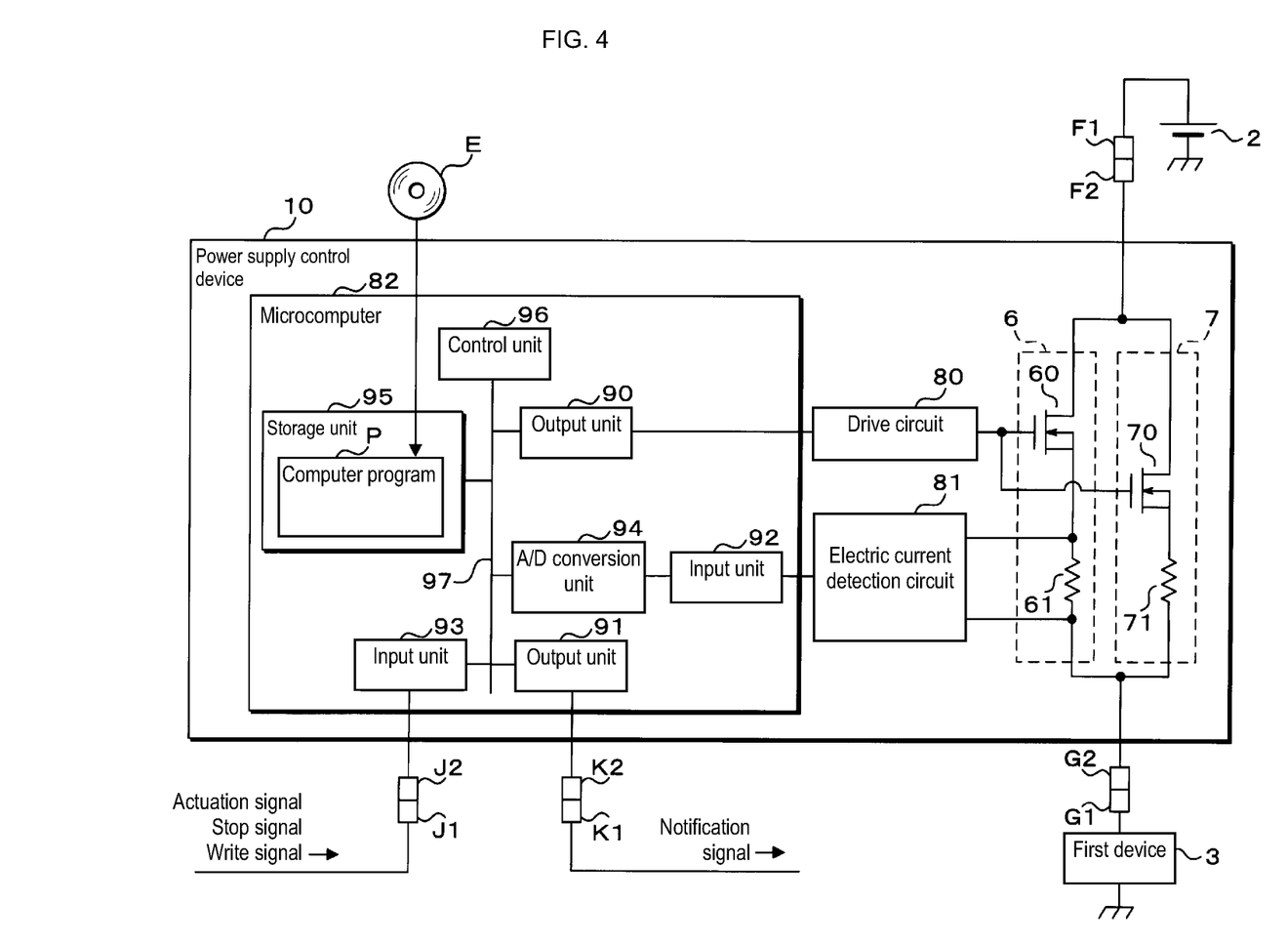
FIG. 4 is a block diagram illustrating a main configuration of a power supply control device.

The power supply control device 10 includes a first switch 60 and a second switch 70 (see FIG. 4). The first switch 60 and the second switch 70 will be described later. The DC power supply 2 supplies power to the first device 3 via the first switch 60 and the second switch 70.

When the actuation signal is input, the power supply control device 10 switches ON the first switch 60 and the second switch 70. Thus, the connectors F2 and G2 are electrically connected so that the DC power supply 2 supplies power to the first device 3 via the power supply control device 10. The first device 3 operates.

When the stop signal is input, the power supply control device 10 switches OFF the first switch 60 and the second switch 70. Thus, electric connection between the connectors F2 and G2 is disconnected so that power supply from the DC power supply 2 to the first device 3 is stopped. The operation of the first device 3 is stopped.

In a case where the first device 3 is connected to the electric junction box 1, when a write signal is input to the power supply control device 10, the power supply control device 10 writes connection data to a storage unit 95 (see FIG. 4) described later. The power supply control device 10 additionally outputs a notification signal indicating completion of writing, via the connectors K2 and K1.

In a case where the first device 3 is not connected to electric junction box 1, when a write signal is input to the power supply control device 10, the power supply control device 10 does not write connection data to the storage unit 95. The power supply control device 10 additionally outputs a notification signal indicating incompletion of writing, via the connectors K2 and K1.

When the connection data is stored in the storage unit 95, the power supply control device 10 detects an open failure of the first switch 60 or the second switch 70. The open failure of the first switch 60 is a failure in which the first switch 60 is fixed in an OFF state so that the first switch 60 cannot be switched ON. Similarly, the open failure of the second switch 70 is a failure in which the second switch 70 is fixed in an OFF state so that the second switch 70 cannot be switched ON.

When the power supply control device 10 detects the open failure of the first switch 60 or the second switch 70, the power supply control device 10 switches OFF a normal switch included in the first switch 60 and the second switch 70 so as to stop power supply from the DC power supply 2 to the first device 3. Thereafter, the power supply control device 10 keeps the first switch 60 and the second switch 70 OFF even when the actuation signal is input.

When the connection data is not stored in the storage unit 95, the power supply control device 10 does not detect the open failure of the first switch 60 or the second switch 70.

As illustrated in FIG. 2, in the low-performance vehicle Cb, the connector F1 and the plurality of connectors H1 are connected to the electric junction box 1 so that the DC power supply 2 and the plurality of second devices 4 are connected to the electric junction box 1. As described above, the DC power supply 2 supplies power to the plurality of second devices 4. On the other hand, in the electric junction box 1, the connectors G1 and G2 are disconnected, the connectors J1 and J2 are disconnected, and the connectors K1 and K2 are disconnected. In this case, the power supply control device 10 does not control the power supply.

The electric junction box 1, the DC power supply 2, and the plurality of second devices 4 are included in a power supply system 5b mounted on the low-performance vehicle Cb.

Procedure for Installing the First Device 3 on the Electric Junction Box 1

Figure 3:
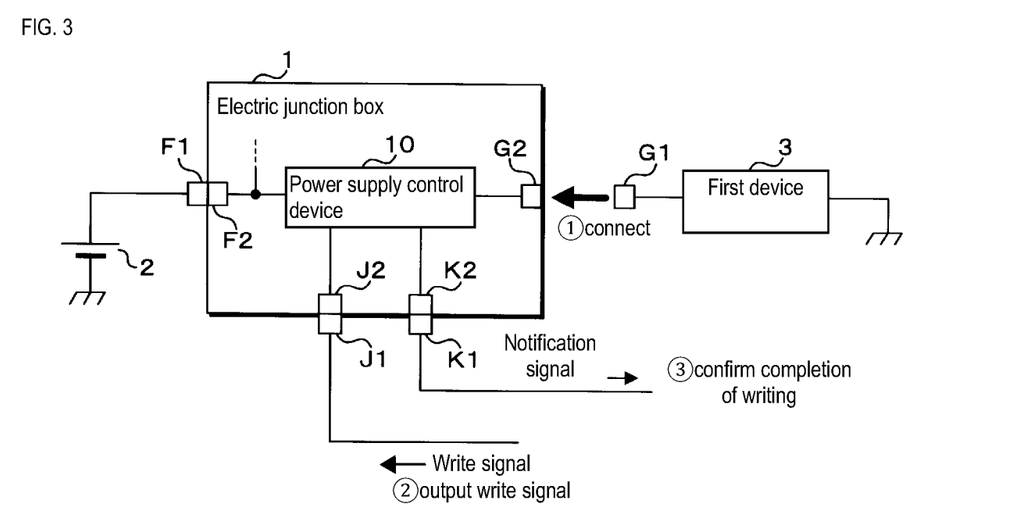
FIG. 3 is an explanatory diagram of a procedure for installing a first device on the electric junction box.

FIG. 3 is an explanatory diagram of a procedure for installing the first device 3 on the electric junction box 1. An installer installs the first device 3 on the electric junction box 1 in a state where the connectors F1, J1, and K1 are connected to the connectors F2, J2, and K2 of the electric junction box 1, respectively. The connectors J1 and K1 are connected to an input/output device (not illustrated) that inputs/outputs signals via two signal lines. The installer operates the input/output device.

When installing the first device 3 on the electric junction box 1, the installer attempts to connect the connector G1 to the connector G2. Next, the installer operates the input/output device to cause the input/output device to output the write signal to the power supply control device 10.

As described above, in a case where the first device 3 is connected to the electric junction box 1, when the write signal is input to the power supply control device 10, the power supply control device 10 writes connection data to the storage unit 95. The power supply device 10 additionally outputs a notification signal indicating completion of writing, to the input/output device. In a case where the first device 3 is not connected to the electric junction box 1, when a write signal is input to the power supply control device 10, the power supply control device 10 does not write connection data to the storage unit 95. The power supply control device 10 additionally outputs a notification signal indicating incompletion of writing, to the input/output device.

The input/output device displays a message indicating completion of writing when the input notification signal indicates completion of writing. The input/output device displays a message indicating incompletion of writing when the input notification signal indicates incompletion of writing. Incompletion of writing indicates that the connector G1 is not connected to the connector G2.

When the installer confirms completion of writing of connection data based on display performed by the input/output device, the installer completes installation of the first device 3. When the input/output device displays incompletion of writing of connection data, the installer attempts connection of the connector G1 to the connector G2 again. The installer causes the input/output device to output a write signal.

Therefore, before the first device 3 is installed on the electric junction box 1, the connection data is not stored in the storage unit 95 so that the power supply control device 10 does not erroneously detect the open failure of the first switch 60 or the second switch 70.

Further, the connection data is not stored in the storage unit 95 included in the power supply control device 10 of the electric junction box 1 mounted on the low-performance vehicle Cb. Therefore, the power supply control device 10 of the electric junction box 1 mounted on the low-performance vehicle Cb does not erroneously detect the open failure of the first switch 60 or the second switch 70. As described above, by mounting the first device 3 on the low-performance vehicle Cb, the vehicle on which the electric junction box 1 is mounted can be changed to the high-performance vehicle Ca. In this case, when the first device 3 is installed on the electric junction box 1, the connection data is written to the storage unit 95 of the power supply control device 10.

The input/output device may be a dedicated device for installing the first device 3 on the electric junction box 1. In this case, when the installer ends installing the first device 3 on the electric junction box 1, the installer removes the input/output device from the electric junction box 1. Thereafter, the installer, for example, connects, to the electric junction box 1, the ECU that outputs the actuation signal and the stop signal.

Configuration of the Power Supply Control Device 10

Next, a configuration of the power supply control device 10 will be described in detail. FIG. 4 is a block diagram illustrating a main configuration of the power supply control device 10. The power supply control device 10 includes a first series circuit 6, a second series circuit 7, a drive circuit 80, an electric current detection circuit 81, and a microcomputer 82. The first series circuit 6 includes the first switch 60 and a first resistor 61. The second series circuit 7 includes the second switch 70 and a second resistor 71. Each of the first switch 60 and the second switch 70 is an N-channel type field effect transistor (FET). The microcomputer 82 includes output units 90 and 91, input units 92 and 93, an analog (A)/digital (D) conversion unit 94, a storage unit 95, and a control unit 96.

Drains of the first switch 60 and the second switch 70 are connected to the connector F2. In the first series circuit 6, a source of the first switch 60 is connected to one end of the first resistor 61. In the second series circuit 7, a source of the second switch 70 is connected to one end of the second resistor 71. The other ends of the first resistor 61 and the second resistor 71 are connected to the connector G2.

As described above, in the first series circuit 6, the first switch 60 and the first resistor 61 are connected in series. In the second series circuit 7, the second switch 70 and the second resistor 71 are connected in series. Further, the second series circuit 7 is connected in parallel to the first series circuit 6. The first series circuit 6 and the second series circuit 7 form a parallel circuit. This parallel circuit is individually connected to the connectors F2 and G2.

Gates of the first switch 60 and the second switch 70 are connected to the drive circuit 80. The drive circuit 80 is further connected to the output unit 90 of the microcomputer 82. One end and the other end of the first resistor 61 are individually connected to the electric current detection circuit 81. The electric current detection circuit 81 is further connected to the input unit 92 of the microcomputer 82. The input unit 92 is further connected to the A/D conversion unit 94. The output units 90 and 91, the input unit 93, the A/D conversion unit 94, the storage unit 95, and the control unit 96 are connected to an internal bus 97. The output unit 91 and the input unit 93 are further connected to the connectors K2 and J2, respectively.

When a voltage of the gate, which has a reference corresponding to a potential of a source, becomes equal to or higher than a constant ON threshold value in the first switch 60, the first switch 60 is switched to ON. When the voltage of the gate, which has the reference corresponding to the potential of the source, becomes less than a constant OFF threshold value in the first switch 60, the first switch 60 is switched to OFF. The ON threshold value is equal to or higher than the OFF threshold value.

Similarly, when a voltage of the gate, which has a reference corresponding to a potential of the source, becomes equal to or higher than the ON threshold value in the second switch 70, the second switch 70 is switched to ON. When the voltage of the gate, which has the reference corresponding to the potential of the source, becomes less than the OFF threshold value in the second switch 70, the second switch 70 is switched to OFF.

The ON threshold values of the first switch 60 and the second switch 70 may be the same or different from each other. Similarly, the OFF threshold values of the first switch 60 and the second switch 70 may be the same or different from each other.

It is assumed that the connectors F1, G1, J1, and K1 are connected to the connectors F2, G2, J2, and K2, respectively.

The output unit 90 of the microcomputer 82 outputs a high-level voltage or a low-level voltage to the drive circuit 80. The output unit 90 switches, to the high-level voltage or the low-level voltage, a voltage output to the drive circuit 80 according to an instruction of the control unit 96. When the voltage output by the output unit 90 is switched from the low-level voltage to the high-level voltage, the drive circuit 80 raises the voltage of the gate, which has a reference corresponding to a ground potential, in each of the first switch 60 and the second switch 70.

Thus, the voltage of the gate, which has the reference corresponding to the potential of the source, becomes equal to or higher than the ON threshold value in each of the first switch 60 and the second switch 70. The first switch 60 and the second switch 70 are switched to ON. When the first switch 60 and the second switch 70 are switched to ON, the DC power supply 2 supplies power to the first device 3 via the first switch 60 and the second switch 70 so that the first device 3 operates. When the two resistance values between the drain and the source of the first switch 60 and the second switch 70 that are ON are substantially the same, electric current values of electric currents flowing through the first switch 60 and the second switch 70, respectively, depend on the resistance values of the first resistor 61 and the second resistor 71.

When the resistance values of the first resistor 61 and the second resistor 71 are the same, the electric current values of the two electric currents flowing through the first switch 60 and the second switch 70 are substantially the same. When the resistance value of the first resistor 61 is larger than the resistance value of the second resistor 71, the electric current value of the electric current flowing through the first switch 60 is smaller than the electric current value of the electric current flowing through the second switch 70. When the resistance value of the first resistor 61 is smaller than the resistance value of the second resistor 71, the electric current value of the electric current flowing through the first switch 60 is larger than the electric current value of the electric current flowing through the second switch 70.

When a voltage output by the output unit 90 is switched from the high-level voltage to the low-level voltage, the drive circuit 80 lowers a voltage of the gate, which has the reference corresponding to the ground potential, in each of the first switch 60 and the second switch 70. Thus, the voltage of the gate, which has the reference corresponding to the potential of the source, becomes less than the OFF threshold value in each of the first switch 60 and the second switch 70. The first switch 60 and the second switch 70 are switched to OFF. When the first switch 60 and the second switch 70 are switched to OFF, the power supply from the DC power supply 2 to the first device 3 is stopped so that the first device 3 stops operating.

When the first switch 60 is ON, the electric current flows in the order of the first switch 60 and the first resistor 61. The electric current detection circuit 81 detects the electric current value of the electric current flowing through the first resistor 61. The electric current detection circuit 81 outputs, to the input unit 92, analog electric current information indicating the detected electric current value. The electric current information is, for example, a voltage value indicating an electric current value detected by the electric current detection circuit 81.

When analog electric current information is input from the electric current detection circuit 81, the input unit 92 outputs the input analog electric current information to the A/D conversion unit 94. When the analog electric current information is input from the input unit 92, the A/D conversion unit 94 converts the input analog electric current information into digital electric current information. The control unit 96 acquires, from the A/D conversion unit 94, the digital electric current information converted by the A/D conversion unit 94. An electric current value indicated by the electric current information acquired by the control unit 96 substantially equals the electric current value of the electric current flowing through the first resistor 61 at the time of acquisition.

The output unit 91 outputs the notification signal indicating completion of writing of the connection data or incompletion of writing of the connection data, via the connectors K2 and K1 according to an instruction of the control unit 96.

Each of the actuation signal, the stop signal, and the write signal is input to the input unit 93 via the connectors J1 and J2. When one of the actuation signal, the stop signal, and the write signal is input, the input unit 93 notifies the control unit 96 of the input signal.

The storage unit 95 is, for example, a non-volatile memory. A computer program P is stored in the storage unit 95. The control unit 96 includes a processing element (computer) such as a central processing unit (CPU), a graphics processing unit (GPU), or a dataflow processor (DFP). The processing element of the control unit 96 executes a writing process, a power supply control process, and an open failure detection process in parallel by executing the computer program P.

The writing process is a process of writing connection data to the storage unit 95. The power supply control process is a process of controlling the power supply from the DC power supply 2 to the first device 3. The open failure detection process is a process of detecting the open failure of the first switch 60 or the second switch 70.

Note that the computer program P may be stored in a storage medium E so as to be readable by the processing element included in the control unit 96. In this case, the computer program P read from the storage medium E by a reading device (not illustrated) is written to the storage unit 95. The storage medium E is an optical disc, a flexible disk, a magnetic disk, a magnetic optical disk, a semiconductor memory, or the like. The optical disc is a compact disc (CD)-read only memory (ROM), a digital versatile disc (DVD)-ROM, a blu-ray (registered trademark) disc (BD), or the like. The magnetic disk is, for example, a hard disk. Further, the computer program P may be downloaded from an external device (not illustrated) connected to a communication network (not illustrated). The downloaded computer program P may be written to the storage unit 95.

Further, the number of processing elements included in the control unit 96 is not limited to one. The number of the processing elements may be two or more. In this case, a plurality of processing elements may jointly execute the writing process, the power supply control process, and the open failure detection process according to the computer program P.

As described above, the storage unit 95 stores the connection data. Further, the storage unit 95 further stores a value of a prohibition flag indicating whether or not power supply control is prohibited. The control unit 96 sets the value of the prohibition flag to 0 or 1. A value of the prohibition flag of 0 means that power supply control is not prohibited. A value of the prohibition flag of 1 means that the power supply control is prohibited.

Description of Writing Process

Figure 5:
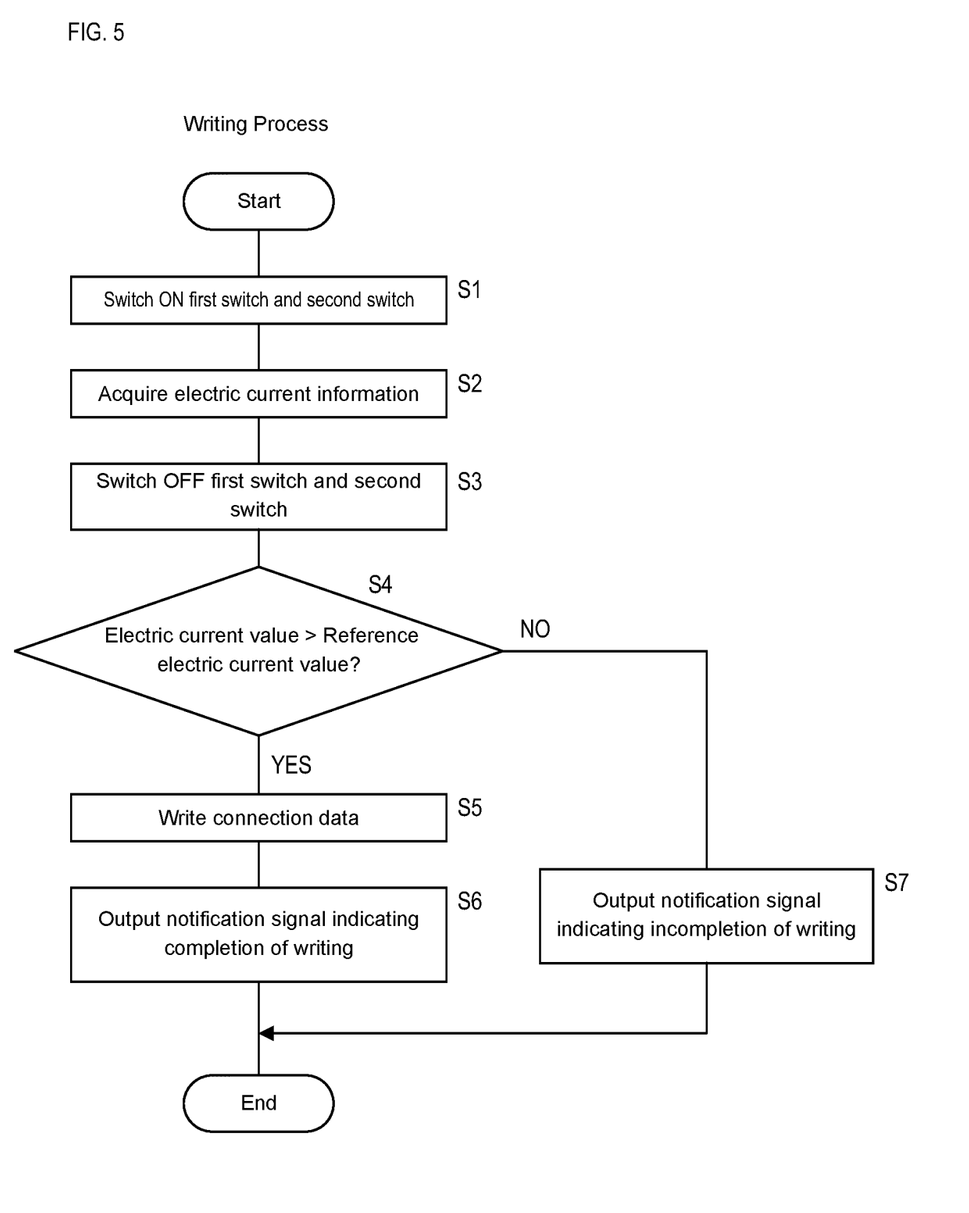
FIG. 5 is a flowchart illustrating a procedure of a writing process.

FIG. 5 is a flowchart illustrating a procedure of the writing process. As described with reference to FIG. 3, the input/output device outputs the write signal to the input unit 93 of the power supply control device 10 in the process of installing the first device 3 on the electric junction box 1. The control unit 96 starts the writing process when the write signal is input to the input unit 93, that is, when an instruction to write the connection data is given.

In the writing process, the control unit 96 first causes the drive circuit 80 to switch ON the first switch 60 and the second switch 70 (step S1). Specifically, the control unit 96 instructs the output unit 90 to switch, to the high-level voltage, the voltage output to the drive circuit 80. As a result, the drive circuit 80 switches ON the first switch 60 and the second switch 70. The drive circuit 80 functions as a switching unit.

It is assumed that the connector F2 is connected to the connector F1. In a case where the connector G1 is connected to the connector G2, when the first switch 60 and the second switch 70 are ON, the DC power supply 2 supplies power to the first device 3 via the first switch 60 and the second switch 70 so that an electric current flows through the first resistor 61. On the other hand, when the connector G1 is not connected to the connector G2, no electric current flows through the first switch 60 and the second switch 70. Therefore, the electric current value of the electric current flowing through the first resistor 61 is 0 A.

A constant reference electric current value is stored in advance in the storage unit 95. The reference electric current value is less than an electric current value that flows through the first resistor 61 when the connector G1 is connected to the connector G2 and the first switch 60 and the second switch 70 are ON. Further, the reference electric current value is 0 A or more. Therefore, in a case where the first switch 60 and the second switch 70 are switched to ON, the fact that a value of an electric current flowing through the first resistor 61 exceeds the reference electric current value means that the connector G2 is connected to the connector G1. In the same case, the fact that a value of an electric current flowing through the first resistor 61 is equal to or less than the reference electric current value means that the connector G2 is not connected to the connector G1.

After executing step S1, the control unit 96 acquires electric current information from the A/D conversion unit 94 (step S2). The electric current information acquired in step S2 is an electric current value detected by the electric current detection circuit 81 in a state where the drive circuit 80 switches ON the first switch 60 and the second switch 70. As described above, the electric current detection circuit 81 detects the electric current value of the electric current flowing through the first resistor 61.

After executing step S2, the control unit 96 causes the drive circuit 80 to switch OFF the first switch 60 and the second switch 70 (step S3). Specifically, the control unit 96 instructs the output unit 90 to switch, to the low-level voltage, the voltage output to the drive circuit 80. Thus, the drive circuit 80 switches OFF the first switch 60 and the second switch 70.

The control unit 96 determines whether or not the electric current value indicated by the electric current information acquired in step S2 exceeds the reference electric current value (step S4). When it is determined that the electric current value exceeds the reference electric current value (S4: YES), the control unit 96 writes connection data to the storage unit 95 (step S5). The control unit 96 also functions as a writing unit.

Next, the control unit 96 instructs the output unit 91 to output a notification signal indicating completion of writing, via the connectors K2 and K1 (step S6). Thereafter, for example, a message indicating completion of writing is displayed on the input/output device so that the installer is notified of completion of writing.

When it is determined that the electric current value is equal to or less than the reference electric current value (S4: NO), the control unit 96 instructs the output unit 91 to output a notification signal indicating incompletion of writing, via the connectors K2 and K1 (step S7). Thereafter, for example, a message indicating incompletion of writing is displayed on the input/output device so that the installer is notified of incompletion of writing.

The control unit 96 ends the writing process after executing one of steps S6 and S7. When the installer confirms incompletion of writing, the installer attempts connection of the connector G1 to the connector G2 again. Then, the installer causes the input/output device to output the write signal to the input unit 93. When the write signal is input to the input unit 93 again, the writing process is executed again.

Description of Power Supply Control Process

Figure 6:
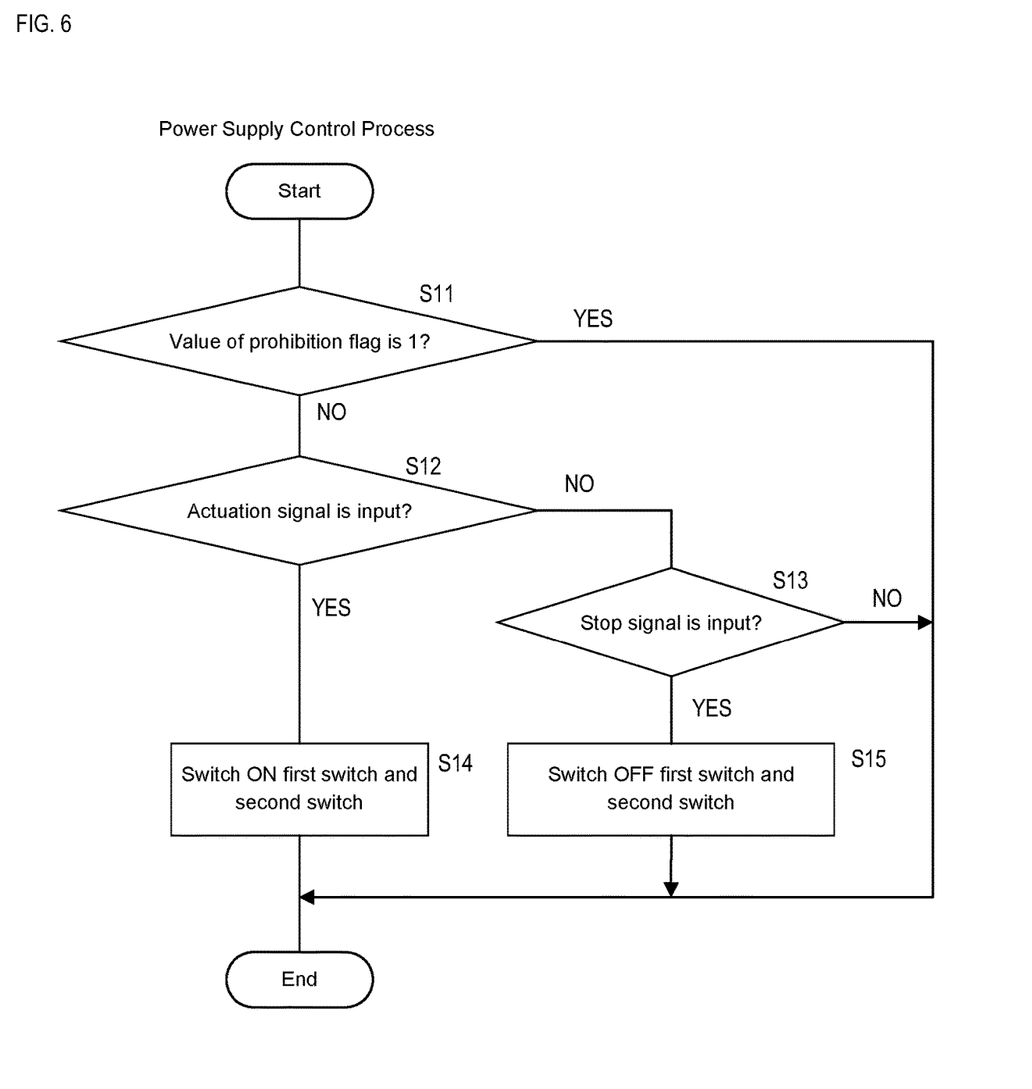
FIG. 6 is a flowchart illustrating a procedure of a power supply control process.

FIG. 6 is a flowchart illustrating a procedure of the power supply control process. The control unit 96 periodically executes the power supply control process. In the power supply control process, first, the control unit 96 determines whether or not the value of the prohibition flag is 1 (step S11). When it is determined that the value of the prohibition flag is 1 (S11: YES), the control unit 96 ends the power supply control process.

When it is determined that the value of the prohibition flag is not 1, that is, the value of the prohibition flag is 0 (S11: NO), the control unit 96 determines whether or not the actuation signal is input to the input unit 93 (step S12). When it is determined that the actuation signal is not input (S12: NO), the control unit 96 determines whether or not the stop signal is input to the input unit 93 (step S13). When it is determined that the stop signal is not input (S13: NO), the control unit 96 ends the power supply control process. When a next cycle arrives, the control unit 96 executes the power supply control process again. Therefore, in a case where the value of the prohibition flag is 0, the input unit 93 waits until the actuation signal or the stop signal is input.

When it is determined that the actuation signal is input (S12: YES), the control unit 96 causes the drive circuit 80 to switch ON the first switch 60 and the second switch 70, as in step S1 of the writing process (step S14). As a result, the DC power supply 2 supplies power to the first device 3 so that the first device 3 operates.

When it is determined that the stop signal is input (S13: YES), the control unit 96 causes the drive circuit 80 to switch OFF the first switch 60 and the second switch 70, as in step S3 of the writing process (step S15). As a result, the power supply from the DC power supply 2 to the first device 3 is stopped so that the operation of the first device 3 is stopped. The control unit 96 ends the power supply control process after executing one of steps S14 and S15. As described above, when a next cycle arrives, the control unit 96 executes the power supply control process again.

As described above, in a case where the value of the prohibition flag is 0, the drive circuit 80 switches ON or OFF the first switch 60 and the second switch 70 in response to input of the actuation signal or the stop signal to the input unit 93. As a result, power supply from the DC power supply 2 to the first device 3 via the first switch 60 and the second switch 70 is controlled in the power supply control device 10.

As will be described later, when the value of the prohibition flag is set to 1, the control unit 96 causes the drive circuit 80 to switch OFF the first switch 60 and the second switch 70. When the value of the prohibition flag is 1, the first switch 60 and the second switch 70 are OFF. In the power supply control process, in a case where the value of the prohibition flag is 1, even when the actuation signal is input to the input unit 93, the first switch 60 and the second switch 70 are not switched to ON so as to be kept OFF.

Description of Open Failure Detection Process

It is assumed that the connectors F1 and G1 are connected to the connectors F2 and G2 illustrated in FIG. 4, respectively. In a case where no failure occurs in the first switch 60 and the second switch 70, when the control unit 96 instructs the output unit 90 to switch, to the high-level voltage, the voltage output to the drive circuit 80, the first switch 60 and the second switch 70 are switched to ON. In this case, an electric current flows through the first resistor 61 so that an electric current value of this electric current exceeds 0 A. Hereinafter, the electric current value of the electric current flowing through the first resistor 61 when the first switch 60 and the second switch 70 are ON will be referred to as a normal electric current value.

In a case where the open failure occurs in the first switch 60, when the drive circuit 80 is instructed to switch ON the first switch 60 and the second switch 70, only the second switch 70 is switched to ON. For this reason, the electric current value of the electric current flowing through the first resistor 61 is 0 A. As described above, the control unit 96 instructs the drive circuit 80 to switch ON the first switch 60 and the second switch 70 by instructing the output unit 90 to switch, to the high-level voltage, the voltage output to the drive circuit 80.

The storage unit 95 stores in advance a lower threshold value that exceeds 0 A and that is equal to or less than the normal electric current value. When the electric current value of the electric current flowing through the first resistor 61 is less than the lower threshold value despite instructing the drive circuit 80 to switch ON the first switch 60 and the second switch 70, this fact means the open failure of the first switch 60.

In a case where the open failure occurs in the second switch 70, when the drive circuit 80 is instructed to switch ON the first switch 60 and the second switch 70, only the first switch 60 is switched to ON. In this case, the electric current value of the electric current flowing through the first resistor 61 is larger than the normal electric current value. Hereinafter, the electric current value of the electric current flowing through the first resistor 61 when the first switch 60 and the second switch 70 are ON and OFF respectively will be referred to as an abnormal electric current value.

The storage unit 95 stores in advance an upper threshold value that is equal to or higher than the normal electric current value and that is less than the abnormal electric current value. When the electric current value of the electric current flowing through the first resistor 61 exceeds the upper threshold value despite instructing the drive circuit 80 to switch ON the first switch 60 and the second switch 70, this fact means the open failure of the second switch 70.

Figure 7:
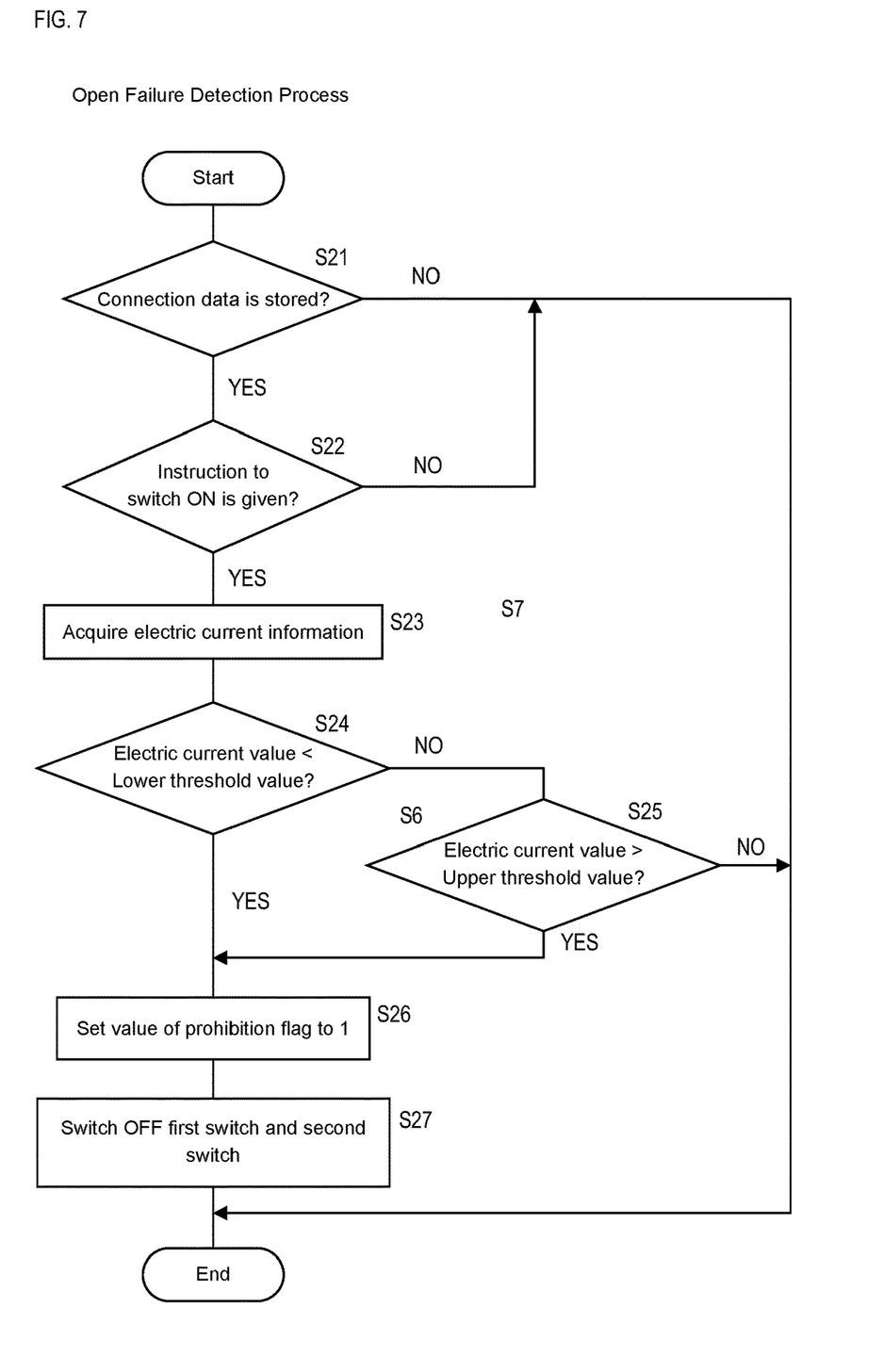
FIG. 7 is a flowchart illustrating a procedure of an open failure detection process.

FIG. 7 is a flowchart illustrating a procedure of the open failure detection process. The control unit 96 periodically executes the open failure detection process. In the open failure detection process, the control unit 96 first determines whether or not the connection data is stored in the storage unit 95 (step S21). When it is determined that the connection data is not stored (S21: NO), the control unit 96 ends the open failure detection process without detecting the open failure. The connection data corresponds to specific data.

When it is determined that the connection data is stored (S21: YES), the control unit 96 determines whether or not the control unit 96 instructs the drive circuit 80 to switch ON the first switch 60 and the second switch 70 (step S22). This instruction is realized by instructing the output unit 90 to switch the output voltage to the high-level voltage. When it is determined that the control unit 96 does not instruct the drive circuit 80 to switch ON the first switch 60 and the second switch 70 (S22: NO), the control unit 96 ends the open failure detection process because the control unit 96 cannot detect the open failure.

When it is determined that the control unit 96 instructs the drive circuit 80 to switch ON the first switch 60 and the second switch 70 (S22: YES), the control unit 96 acquires electric current information from the A/D conversion unit 94 (step S23).

Subsequently, the control unit 96 determines whether or not the electric current value indicated by the electric current information acquired in step S23, that is, the electric current value of the electric current flowing through the first resistor 61 is less than the lower threshold value (step S24). When it is determined that the electric current value is equal to or higher than the lower threshold value (S24: NO), the control unit 96 determines whether or not the electric current value indicated by the electric current information acquired in step S23 exceeds the upper threshold value (step S25).

When it is determined that the electric current value is equal to or less than the upper threshold value (S25: NO), the control unit 96 ends the open failure detection process on the assumption that the open failure does not occur in the first switch 60 or the second switch 70. When a next cycle arrives, the control unit 96 executes the open failure detection process again.

When it is determined that the electric current value is less than the lower threshold value (S24: YES), or when it is determined that the electric current value exceeds the upper threshold value (S25: YES), the control unit 96 sets the value of the prohibition flag to 1 on the assumption that the open failure occurs in the first switch 60 or the second switch 70 (step S26). As described above, the fact that the electric current value indicated by the electric current information acquired in step S23 is less than the lower threshold value means that the open failure occurs in the first switch 60. The fact that the electric current value indicated by the electric current information acquired in step S23 exceeds the upper threshold value means that the open failure occurs in the second switch 70.

Therefore, determining that the electric current value is less than the lower threshold value in step S24 and determining that the electric current value exceeds the upper threshold value in step S25 correspond to detecting the open failure. The control unit 96 also functions as an open failure detection unit.

After executing step S26, the control unit 96 causes the drive circuit 80 to switch OFF the first switch 60 and the second switch 70 as in step S3 of the writing process (step S27). Therefore, a switch in which the open failure does not occur, among the first switch 60 and the second switch 70 is switched to OFF so that power supply from the DC power supply 2 to the first device 3 is stopped. Thereafter, in the power supply control process, a switch in which the open failure does not occur is not switched to ON. For this reason, an electric current having a large electric current value does not flow through the first switch 60 or the second switch 70 so that no failure occurs even in the switch in which the open failure does not occur, among the first switch 60 and the second switch 70.

After executing step S27, the control unit 96 ends the open failure detection process. When a next cycle arrives, the control unit 96 executes the open failure detection process again.

Effects and Notes

As described above, in the open failure detection process, the control unit 96 can detect the open failure of the first switch 60 or the second switch 70 based on the electric current value of the electric current flowing through the first resistor 61. In addition, in installation of the first device 3 on the electric junction box 1, when the first device 3 is connected to the parallel circuit of the first series circuit 6 and the second series circuit 7, that is, when the connector G1 is connected to the connector G2, the control unit 96 writes the connection data to the storage unit 95.

Specifically, the control unit 96 gives an instruction to switch ON the first switch 60 and the second switch 70 in the writing process executed when the write signal is input. In this state, when the electric current value of the electric current flowing through the first resistor 61 exceeds the reference electric current value, the control unit 96 writes the connection data to the storage unit 95. In this way, when an electric current path of an electric current flowing through the first switch 60 and the second switch 70 is formed so as to enable power supply through the first switch 60 and the second switch 70, the control unit 96 writes the connection data to the storage unit 95.

Therefore, while the power supply through the first switch 60 and the second switch 70 is enabled, that is, while the electric current path of the electric current flowing through the first switch 60 and the second switch 70 is not formed, connection data is not stored in the storage unit 95. Therefore, while the power supply through the first switch 60 and the second switch 70 is not enabled, for example, while the first device 3 is not connected to the electric junction box 1, the open failure of the first switch 60 is not erroneously detected. Even while the power supply through the first switch 60 and the second switch 70 is not enabled, the drive circuit 80 may erroneously switch ON the first switch 60 and the second switch 70 due to an influence of disturbance noise, for example. In this case, the electric current value of the electric current flowing through the first resistor 61 is 0 A so as to be is less than the lower threshold value. Therefore, in a configuration different from the configuration of the present embodiment, that is, in a configuration in which connection data is not written, it is possible that the open failure of the first switch 60 is erroneously detected.

Note that in the present embodiment, instead of the connection data, for example, a value of a connection flag set to 0 or 1 may be stored in the storage unit 95. Regarding the value of the connection flag, for example, 0 corresponds to the fact that the first device 3 is not connected to the electric junction box 1, and 1 corresponds to the fact that the first device 3 is connected to the electric junction box 1.

When the connection flag is used, the value of the connection flag is set to 1 instead of writing the connection data in step S5 of the writing process. The value of the connection flag is set to 0 until step S5 is executed. In step S21 of the open failure detection process, it is determined whether or not the value of the connection flag is 1 instead of whether or not the connection data is stored. The control unit 96 executes step S22 when it is determined that the value of the connection flag is 1. The control unit 96 ends the open failure detection process when it is determined that the value of the connection flag is 0. A configuration for changing the value of the connection flag has a similar effect to that of a configuration for writing the connection data. In this case, the connection flag having the value of 1 corresponds to the specific data.

Further, the number of second devices 4 mounted on each of the high-performance vehicle Ca and the low-performance vehicle Cb is not limited to two or more, and may be one. Further, each of the first switch 60 and the second switch 70 is not limited to the N-channel type FET, and may be a semiconductor switch such as a P-channel type FET, an insulated gate bipolar transistor (IGBT), or a bipolar transistor.

It should be considered that the disclosed present embodiment is exemplary and is not restricted in all respects. The scope of the present invention is indicated by the scope of claims, not the meaning described above, and is intended to include all modifications within the meaning and scope equivalent to the scope of claims.

The invention claimed is:

1. A power supply control device that switches ON or OFF a first switch and a second switch to control power supply via the first switch and the second switch, comprising:
    a first series circuit in which a first resistor and the first switch are connected in series;
    a second series circuit in which a second resistor and the second switch are connected in series, the second series circuit being connected in parallel to the first series circuit;
    an electric current detection circuit that detects an electric current value of an electric current flowing through the first resistor;
    a storage unit in which data is stored; and
    an open failure detection unit that detects an open failure of the first switch or the second switch based on the electric current value detected by the electric current detection circuit when specific data is stored in the storage unit and that does not detect the open failure when the specific data is not stored in the storage unit.

2. The power supply control device according to claim 1, further comprising
    a writing unit that writes the specific data to the storage unit when an electric device is connected to the parallel circuit of the first series circuit and the second series circuit.

3. The power supply control device according to claim 1, further comprising:
    a switching unit that switches ON the first switch and the second switch when an instruction to write the specific data is given; and
    a writing unit that writes the specific data to the storage unit when the electric current value detected by the electric current detection circuit exceeds a predetermined electric current value in a state where the switching unit switches ON the first switch and the second switch.

4. An open failure detection method comprising:
    acquiring an electric current value of an electric current flowing through a first resistor of a parallel circuit in which a first series circuit is connected in parallel to a second series circuit, a first switch and the first resistor being connected in series in the first series circuit, a second switch and a second resistor being connected in series in the second series circuit; and
    detecting an open failure of the first switch or the second switch based on the acquired electric current value when specific data is stored in a storage unit,
    wherein the open failure is not detected when the specific data is not stored in the storage unit.

5. A computer program that causes a computer to execute:
    acquiring an electric current value of an electric current flowing through a first resistor of a parallel circuit in which a first series circuit is connected in parallel to a second series circuit, a first switch and the first resistor being connected in series in the first series circuit, a second switch and a second resistor being connected in series in the second series circuit; and
    detecting an open failure of the first switch or the second switch based on the acquired electric current value when specific data is stored in a storage unit,
    wherein the open failure is not detected when the specific data is not stored in the storage unit.

* * * * *